(12) United States Patent
Tani

(10) Patent No.: US 7,534,551 B2
(45) Date of Patent: May 19, 2009

(54) PLANOGRAPHIC PRINTING PLATE MATERIAL

(75) Inventor: Kunio Tani, Tokyo (JP)

(73) Assignee: Konica Minolta Medical & Graphic, Inc., Shinjuku-Ku (JP)

( * ) Notice: Subject to any disclaimer, the term of this patent is extended or adjusted under 35 U.S.C. 154(b) by 0 days.

(21) Appl. No.: 11/668,611

(22) Filed: Jan. 30, 2007

(65) Prior Publication Data

US 2007/0190456 A1     Aug. 16, 2007

(30) Foreign Application Priority Data

Feb. 10, 2006   (JP) .............................. 2006-033588

(51) Int. Cl.
- G03F 7/027   (2006.01)
- G03F 7/032   (2006.01)
- B41N 1/14    (2006.01)
- G03F 7/033   (2006.01)

(52) U.S. Cl. .................... 430/284.1; 430/302; 430/910; 522/95

(58) Field of Classification Search ............... 430/284.1
See application file for complete search history.

(56) References Cited

U.S. PATENT DOCUMENTS

| | | | | |
|---|---|---|---|---|
| 4,177,074 A * | 12/1979 | Proskow | ................. | 430/286.1 |
| 4,264,708 A * | 4/1981 | Chambers et al. | ......... | 430/278.1 |
| 4,273,857 A * | 6/1981 | Leberzammer et al. | .. | 430/281.1 |
| 5,006,434 A * | 4/1991 | Blanchet-Fincher et al. | .. | 430/49 |
| 5,043,237 A * | 8/1991 | Blanchet-Fincher et al. | .. | 430/49 |
| 5,149,776 A * | 9/1992 | Kushi et al. | .............. | 430/288.1 |
| 5,175,040 A * | 12/1992 | Harpell et al. | .............. | 428/113 |
| 5,393,637 A * | 2/1995 | Kanda et al. | ................. | 430/138 |
| 5,728,505 A * | 3/1998 | Dueber et al. | ............ | 430/271.1 |
| 2001/0007736 A1 * | 7/2001 | Takasaki et al. | .......... | 430/281.1 |
| 2003/0175622 A1 * | 9/2003 | Hu et al. | .................. | 430/285.1 |
| 2004/0229165 A1 * | 11/2004 | Munnelly et al. | ........ | 430/281.1 |

FOREIGN PATENT DOCUMENTS

| EP | 0 607 962 A1 * | 7/1994 |
|---|---|---|
| EP | 1452916 A2 * | 9/2004 |

OTHER PUBLICATIONS

Sartomer Coating Concepts, vol. V, dated Feb. 2003, reprinting an artcile "cFast-Curing Oligomers for Enhanced Coating Performance" from an issue of Oct. 2002 of Paint & Coatings Industry.*

"Amide." McGraw-Hill Encyclopedia of Science and Technology. The McGraw-Hill Companies, Inc., 2005. Answers.com Aug. 27, 2007. http://www.answers.com/topic/amide.*

"Amides" Glossary of Class Names of Organic Compounds and Reactive Intermediates Based on Structure (IUPAC Recommendations 1994) http://www.chem.qmul.ac.uk/iupac/class/ Prepared for publication by: G. P. Moss, P. A. S. Smith, D. Tavernier, Nitrogen (one atom N only) section. no month given.*

Functional Group from Wikipedia,the free encyclopediahttp://en.wikipedia.org/wiki/Functional_group, last modified Sep. 13, 2007. pp. 9.*

* cited by examiner

*Primary Examiner*—Cynthia Hamilton

(74) *Attorney, Agent, or Firm*—Lucas & Mercanti, LLP

(57) ABSTRACT

An objective is to provide a planographic printing plate material exhibiting excellent developability, printing durability, together with excellent oxygen-shielding layer adhesion and moisture dependence after exposure. Disclosed is a planographic printing plate material possessing a support provided thereon, a photosensitive layer, wherein the photosensitive layer comprises (A) at least two binder polymers comprising different glass transition points (Tg) from each other, (B) a polymerizable ethylenic double bond-containing compound, and (C) a photopolymerization initiator.

4 Claims, No Drawings

PLANOGRAPHIC PRINTING PLATE MATERIAL

This application claims priority from Japanese Patent Application No. 2006-033588 filed on Feb. 10, 2006, which is incorporated hereinto by reference.

TECHNICAL FIELD

The present invention relates to a planographic printing plate material.

BACKGROUND

In the past, the PS plate comprising a hydrophilic support and provided thereon, an oleophilic resin layer was widely utilized as a planographic printing plate material (planographic printing plate original plate), and a desired printing plate was produced usually by dissolving and removing non-image portions after conducting a mask lithography process via a lith film as a plate making process.

Presently, digital technique electronically processing, storing and outputting image information employing a computer has widely spread, and a variety of newly developed image outputting systems corresponding to such the digital technique have been put to practical use, whereby a computer-to-plate (CTP) system with which a printing plate is directly prepared via no lith film by scanning highly directional light such as laser light according to digitalized image information is demanded, and development of a photopolymerizable composition which is curable in high sensitivity and adaptable for this has actively done.

Among planographic printing plate materials suitable for such the CTP system, a planographic printing plate material comprising a polymerization type photosensitive layer containing a polymerizable compound and a binder polymer is utilized in the field of printing in which high printing durability is demanded. As the polymerization type photosensitive layer, commonly known is a photosensitive layer containing an alkali-soluble (meth)acrylic copolymer, a polymerizable (meth)acrylic acid ester and a polymerization intiator (refer to Patent Document 1, for example).

Further, as to the planographic printing plate material containing these polymerization type photosensitive layers, the photosensitive layer suffers from the effects of oxygen in the air, even though the photosensitive layer is formed, whereby reduced sensitivity and insufficient storage stability result. As a method of suffering from less effects of oxygen in the air, known is a method of providing an oxygen-shielding layer (protective layer) on a photosensitive layer (refer to Patent Documents 2 and 3, for example).

In order to improve printing durability desired for the planographic printing plate material, higher glass transition point (Tg) of a binder polymer to enhance strength of a photosensitive layer is effective, but there are still problems such that solubility to an alkali developer and adhesion to an oxygen-shielding layer are deteriorated. Further, exposure at high-humidity causes a problem such that sensitivity is lowered, and dot reproduction is deteriorated since oxygen permeability is high.

(Patent Document 1) Japanese Patent O.P.I. Publication No. 2003-295426

(Patent Document 2) Japanese Patent O.P.I. Publication No. 2002-169272

(Patent Document 3) Japanese Patent O.P.I. Publication No. 9-204049

SUMMARY

It is an object of the present invention to provide a planographic printing plate material exhibiting excellent developability, printing durability, together with excellent oxygen-shielding layer adhesion and moisture dependence after exposure. Disclosed is a planographic printing plate material possessing a support provided thereon, a photosensitive layer, wherein the photosensitive layer comprises (A) at least two binder polymers comprising different glass transition points (Tg) from each other, (B) a polymerizable ethylenic double bond-containing compound, and (C) a photopolymerization initiator.

DESCRIPTION OF THE PREFERRED EMBODIMENTS

The above object of the present invention is accomplished by the following structures.

(Structure 1) A planographic printing plate material comprising a support and provided thereon, a photosensitive layer, wherein the photosensitive layer comprises (A) at least two binder polymers comprising different glass transition points (Tg) from each other; (B) a polymerizable ethylenic double bond-containing compound; and (C) a photopolymerization initiator.

(Structure 2) The at least two binder polymers of Structure 1, wherein a smallest Tg difference among Tg differences of any two binder polymers is at least 10° C.

(Structure 3) The at least two binder polymers of Structure 2, wherein the smallest Tg difference is at least 20° C.

(Structure 4) The at least two binder polymers of any one of Structures 1-3, wherein at least one binder polymer has a Tg of at least 110° C.

(Structure 5) The at least two binder polymers of any one of Structures 1-3, wherein at least one binder polymer has a Tg of at most 90° C.

(Structure 6) The planographic printing plate material of Structure 1, wherein the ethylenic double bond-containing compound comprises a multifunctional acrylate comprising an amide bond and a tertiary amino group in a molecule.

While the preferred embodiments of the present invention have been described using specific terms, such description is for illustrative purposes only, and it is to be understood that changes and variations may be made without departing from the spirit or scope of the appended claims.

DETAILED DESCRIPTION OF THE INVENTION

After considerable effort during intensive studies, the inventor has found out that a planographic printing plate material exhibiting excellent developability, printing durability, together with excellent oxygen-shielding layer adhesion and moisture dependence after exposure can be realized by using the planographic printing plate material comprising a support and provided thereon, a photosensitive layer, wherein the photosensitive layer comprises (A) at least two binder polymers comprising different glass transition points (Tg) from each other; (B) a polymerizable ethylenic double bond-containing compound; and (C) a photopolymerization initiator.

It is a feature in the present invention that the planographic printing plate material comprises at least two binder polymers having different glass transition points (Tg) from each other, and exhibits not only excellent printing durability, developability, oxygen-shielding layer adhesion, but also an excellent coating property and dot reproduction at high-humidity. The glass transition temperature (Tg) in the present invention refers to a temperature at which two straight lines, obtained when the specific volume of a polymer is plotted against temperature, cross, as defined in "Kobunshi Kagaku" published in 1993 by Kyoritu Shuppan Co. Glass transition temperature is measured through a differential scanning calorimeter (DSC). The glass transition temperature (Tg) of each of polymeric compounds in the present invention is also measured through the DSC.

Next, the present invention will be described in detail.

(Binder Polymer)

The binder polymer will now be described.

Examples of the binder polymer, which is often called polymer binder, include an acryl based polymer, a polyvinyl butyral resin, a polyurethane resin, a polyamide resin, a polyester resin, an epoxy resin, a phenol resin, a polycarbonate resin, and a polyvinyl formal resin, shellac, and others such as a natural resin and the like. These may be used in combination with at least two kinds.

Of these, preferred are vinyl based copolymers produced by copolymerizing acryl based monomers. Further, it is preferable that the binder polymers are copolymers composed of (a) carboxyl group-containing monomers and (b) alkyl methacrylates or alkyl acrylates.

Preferred specific example of monomers having a carboxyl group include α, β-unsaturated carboxylic acids such as acrylic acid, methacrylic acid, maleic acid, maleic anhydride, itaconic acid, and itaconic anhydride. In addition, also preferred are carboxylic acids such as a halfester of phthalic acid and 2-hydroxymethacrylate.

Specific examples of the alkyl ester methacrylate and the alkyl ester acylate include unsubstituted alkyl esters such as methyl methacrylate, ethyl methacrylate, propyl methacrylate, butyl methacrylate, amyl methacrylate, hexyl methacrylate, heptyl methacrylate, octyl methacrylate, nonyl methacrylate, decyl methacrylate, undecyl methacrylate, dodecyl methacrylate, methyl acrylate, ethyl acrylate, propyl acrylate, butyl acrylate, amyl acrylate, hexyl acrylate, heptyl acrylate, octyl acrylate, nonyl acrylate, decyl acrylate, undecyl acrylate, or dodecyl acrylate; cyclic alkyl esters such as cyclohexyl methacrylate or cyclohexyl acrylate; and substituted alkyl esters such as benzyl methacrylate, 2-chloroethyl methacrylate, N,N-dimethylaminoethyl methacrylate, glycidyl methacrylate, benzyl acrylate, 2-chloroethyl acrylate, N,N-dimethylaminoethyl acrylate, or glycidyl acrylate.

Further, in the binder polymers of the present invention, employed as other copolymerization monomers may be those described in the following (1)-(14).

(1) Monomers having an aromatic hydroxyl group, such as o- (or p- or m-) hydroxystyrene or o (or p- or m-) hydroxyphenyl acrylate.

(2) Monomers having an aliphatic hydroxyl group, such as 2-hydroxyethyl acrylate, 2-hydroxyethyl methacrylate, N-methylolacrylamide, 4-hydroxybutyl methacrylate, 5-hydroxypentyl acrylate, 5-hydroxypentyl methacrylate, 6-hydroxyhexyl acrylate, 6-hydroxyhexyl methacrylate, N-(2-hydroxyethyl)acrylamide, N-(2-hydroxyethyl)methacrylamide, or hydroxyethyl vinyl ether (3) Monomers having an aminosulfonyl group, such as m- (or p-)aminosulfonylphenyl methacrylate, m- (or p-) aminosulfonylphenyl acrylate, N-(p-aminosulfonylphenyl)methacrylamide, or N-(p-aminosulfonylphenyl)acrylamide (4) Monomers having a sulfonamide group, such as (p-toluenesulfonyl)acrylamide or N-(p-toluenesulfonyl) methacrylamide (5) Acrylamides or methacrylamides, such as acrylamide, methacrylamide, N-ethylacrylamide, N-hexylacrylamide, N-cyclohexylacrylamide, N-phenylacrylamide, N-(4-nitrophenyl)acrylamide, N-ethyl-N-phenylacrylamide, N-(4-hyroxyphenyl)acrylamide, or N-(4-hydroxyphenyl)methacrylamide (6) Monomers having a fluorinated alkyl group, such as trifluoroethyl acrylate, trifluoroethyl methacrylate, tetrafluoropropyl methacrylate, hexafluoropropyl methacrylate, octafluoropentyl acrylate, octafluoropentyl methacrylate, heptadecafluorodecyl methacrylate, or N-butyl-N-(2-acryloxyethyl)heptadecafluorooctylsufonamide (7) Vinyl ethers, such as ethyl vinyl ether, 2-chloroethyl vinyl ether, propyl vinyl ether, butyl vinyl ether, octyl vinyl ether, or phenyl vinyl ether (8) Vinyl esters, such as vinyl acetate, vinyl chloroacetate, vinyl butyrate, or vinyl benzoate (9) Styrenes such as styrene, methylstyrene, or chioromethylstyrene

(10) Vinyl ketones, such as methyl vinyl ketone, ethyl vinyl ketone, propyl vinyl ketone, or phenyl vinyl ketone

(11) Olefins, such as ethylene, propylene, i-butylene, or isoprene

(12) N-vinylpyrrolidone, N-vinylcarbazole, or 4-vinylpyridine

(13) Monomers having a cyano group, such as acrylonitrile, methacrylonitrile, 2-pentenenitrile, 2-methyl-3-butenenitrile, 2-cyanoethyl acrylate, or o-)or m- or p-) cyanostyrene, and

(14) Monomers having an amino group, such as N,N-diethylaminoethyl methacrylate, N,N-dimethylaminoethyl acrylate, N,N-dimethylaminoethyl methacrylate, polybutadieneurethane acrylate, N,N-dimethylaminopropylacrylamide, N,N-dimethylaminopropylacrylamide, N,N-dimethylacrylamide, acryloylmorpholine, N-i-propylacrylamide, or N,N-diethylacrylamide.

Further, other monomers capable of copolymerizing with these monomers may be copolymerized.

Further, the binder polymers used in the present invention are preferably vinyl based polymers having a carboxyl group on the side chain and a polymerizable double bond. It is possible to produce such binders in such a manner that a carboxyl group in the molecule of the above vinyl based copolymers undergoes addition reaction with compounds having, in the molecule, a (meth)acryloyl group and an epoxy group. Unsaturated bond containing vinyl based copolymers are also preferred as a binder polymer.

Specific examples of compounds having, in the molecule, both an unsaturated bond and an epoxy group include glycidyl acrylate and glycidyl methacrylate, as well as epoxy group containing unsaturated compounds described in Japanese Patent O.P.I. Publication No. 11-271969. Further, it is possible to produce the above compounds in such a manner that the hydroxyl group in the molecule of the above vinyl based polymers undergoes addition reaction with compounds having, in the molecule, a (meth)acryloyl group and an isocyanate group. Unsaturated bond containing vinyl based copolymers are also preferred as a binder polymer. Preferably listed as compounds having, in the molecule, both an unsaturated bond and an isocyanate group are vinyl isocyahate, (meth)acryl isocyanate, 2-(meth)acryloyloxyethyl isocyanate, and m- or p-isopropenyl-α,α'-dimethylbenzyl isocyanate, while listed are (meth)acryl isocyanate and 2-(meth)acryloyloxyethyl isocyanate.

It is possible to perform addition reaction of compounds having, in the molecule, a (meth)acryloyl group and an epoxy group to the carboxyl group in the molecule of vinyl based copolymers, employing methods known in the art. It is possible to perform reaction at a reaction temperature of 20-100° C., preferably 40-80° C., but most preferably at lower than or equal (during refluxing) to the boiling point of used solvents, over a reaction time of 2-10 hours but preferably 3-6 hours. Listed as employed solvents are those which are employed in the polymerization reaction of the above vinyl based polymers. Further, after the polymerization reaction, solvents are not removed but are further usable in the introduction reaction of alicyclic epoxy group containing unsaturated compounds. Further, if required, the reaction may be performed in the presence of catalysts and polymerization inhibitors Preferred as such catalysts are amine based or ammonium chloride based compounds. Specific amine based compounds include triethylamine, tributylamine, dimethylaminoethanol, diethylaminoethanol, methylamine, ethylamine, n-propylamine, isopropylamine, 3-methoxypropylamine, butylamine, allylamine, hexylamine, 2-ethylhexylamine, and benzylamime, while the ammonium chloride based compound includes triethylbenzylammonium chloride.

When these are employed as a catalyst, the added amount is in the range of 0.01-20.0% by weight with respect to the employed unsaturated compounds having an alicyclic epoxy group. Further, listed as polymerization inhibitors are hydroquinone, hydroquinone monomethyl ether, tert-butylhydroquinone, 2,5-di-tert-butylhydroquinone, methylhydroquinone, p-benzoquinone, methyl-p-benzoquinone, tert-butyl-p-benzoquinone, and 2,5-diphenyl-p-benzoquinone. The employed amount is 0.01-5.0% by weight with respect to the employed unsaturated compounds having an alicyclic epoxy group. Progress of the reaction is monitored via the acid value of the reaction system, and when the acid value reaches 0, the reaction is terminated.

It is possible to perform addition reaction of compounds, having in the molecule, a (meth)acryloyl group and an isocyanate group, to a hydroxyl group in the molecule of a vinyl based polymer, employing methods known in the art. It is possible to perform reaction at a reaction temperature of 20-100° C., preferably 40-80° C., but most preferably at lower than or equal to (during refluxing) the boiling point of used solvents, for a reaction time of 2-10 hours but preferably 3-6 hours. Listed as employed solvents are those which are employed in the polymerization reaction of the above copolymers. Further, after the polymerization reaction, solvents are not removed but are usable in the introduction reaction of an unsaturated compound containing an isocyanate group. Further, if required, the reaction may be performed in the presence of catalysts and polymerization inhibitors. Herein, preferred as such catalysts are tin based or amine based compounds, specific examples of which include dibutyl tin laurate and triethylamine.

The added amount of catalysts is preferably in the range of 0.01-20.0% by weight with respect to the employed compounds having a double bond. Further, listed as polymerization inhibitors are hydroquinone, hydroquinone monomethyl ether, tert-butylhydroquinone, 2,5-di-tert-butylhydroquinone, methylhydroquinone, p-benzoquinone, methyl-p-benzoquinone, and tert-butyl-p-benzoquinone. The used amount is typically 0.01-5.0% by weight with respect to the employed unsaturated compounds having an isocyanate group. The progress of the reaction is monitored via inspecting the presence of the isocyanate group in the reaction system, based on the infrared absorption spectra (IR), and if no absorption is noticed, the reaction may be terminated.

The amount of vinyl based polymers having a carboxyl group and a polymerizable double bond on the side chain is preferably 50-100% by weight based on the total binder polymers, but is more preferably 100% by weight.

Mw of a binder polymer of the present invention is preferably 5,000-100,000, and more preferably 10,000-80,000, still more preferably 15,000-60,000, and most preferably 15,000-50,000. In the case of an Mw of less than 5,000, fluidity of a photosensitive layer is high at ambient temperatures, whereby problems concerning tackiness, productivity and storage stability are easily caused. In the case of Mw exceeding 100,000, a reaction efficiency at the polymerization completion process via heat treatment after exposure tends to be deteriorated. Mw (weight average molecular weight) means a value measured by gel permeation chromatography (GPC).

The binder polymer of the present invention has an acid value of preferably 20-180 mg/KOH, of more preferably 30-100 mg/KOH, and of still more preferably 40-95 mg/KOHE. In the case of an acidic value of less than 20 mg/KOH, problems such as a stain property and so forth tend to be produced since development solubility is degraded.

In view of sensitivity, the content of the binder polymer is preferably 10-90% by weight, based on the weight of the photosensitive layer, more preferably 15-70% by weight, and still more preferably 20-60% by weight.

[Ethylenic Double Bond-Containing Compound]

Employed as ethylenic double bond-containing compounds of the present invention may be common radically polymerizable monomers, as well as multifunctional monomers or multifunctional oligomers, having a plurality of polymerizable ethylenic double bonds in the molecule, commonly employed as a UV curable resin.

These ethylenic double bond-containing compounds are not particularly limited, but listed as preferred examples may be mono-functional acrylic acid esters of acrylate or of $\epsilon$-caprolactone adducts of 2-ethylhexyl acrylate, 2-hydroxypropyl acrylate, glycerol acrylate, tetrahydrofurfuryl acrylate, phenoxyethyl acrylate, nonylphenoxyethyl acrylate, tetrahydrofurfuryloxyethyl acrylate, tetrahydrofurfuryloxyhexanolid acrylate or 1,3-dioxolane acrylate; monofunctional acrylic acid esters such as acrylates of $\epsilon$-caprolactone adducts of 1,3-dioxane alcohol or 1,3-dioxolane acrylates, or methacrylic acid, itaconic acid, crotonic acid, maleic acid esters in which these acrylates are changed to methacrylate, crotonate, or maleate, such as ethylene glycol diacrylate, triethylene glycol diacrylate, pentaerythritol diacrylate, hydroquinone diacrylate, resorcinol diacrylate, hexanediol diacrylate, neopentylglycol diacrylate, tripropylene glycol diacrylate, diacrylate of hydroxypivalic acid neopentylglycol, diacrylate of neopentylglycol adipate, diacrylate of $\epsilon$-caprolactone adduct of hydroxypivalic acid neopentyl glycol, $\epsilon$-caprolactone adducts of 2-(2-hydroxy-1,1-dimethylethyl)-5-hydrocymethyl-5-ethyl-1,3-dioxane diacrylate, tricyclodecanedimethylol acrylate, or tricyclodecanedimethylol acrylate, bifunctional acrylic esters such as diacrylates of diglycidyl ether of 1,6-hexanediol, or methacrylic acid, itaconic acid, crotonic acid, and maleic acid esters, in which each of these acrylates are replaced with methacrylate, itaconate, crotonate, or maleate, such as $\epsilon$-caprolactone adducts of trimethylolpropane triacrylate, ditrimethylolpropane tetraacrylate, trimethylolethane triacrylate, pentaerythritol triacrylate, pentaerythritol tetraacrylate, dipentaerythritol tetraacrylate, dipentaerythritol pentaacrylate, dipentaerythritol hexaacrylate, or dipentaerythritol hexaacrylate; multifunctional acrylate ester acids such as pyrogallol triacrylate, propionic acid-dipentaerythritol triacrylate, propionic acid-dipentaerythritol tetraacrylate, or hydroxypivalylaldehyde modified dimethylolpropane triacrylate or methacrylic acid, itaconic acid, crotonic acid, or maleic esters in which each of these acrylates is replaced by methacrylate, itaconate, crotonate, or maleate.

It is also possible to employ pre-polymers in the same manner as above. Pre-polymers may be used singly or in combination with at least two kinds, or via mixing with the above monomers and/or oligomers.

Examples of pre-polymers include polyester acrylates which are prepared in such a manner that (meth)acrylic acid is introduced into polyester which is prepared by bonding polybasic acids such as adipic acid, trimellitic acid, maleic acid, phthalic acid, terephthalic acid, humic acid, malonic acid, succinic acid, glutaric acid, itaconic acid, pyromellitic acid, fumaric acid, pimelic acid, sebacic acid, dodecanic acid, or tetrahydrophthalic acid to polyhydric alcohol such as ethylene glycol, propylene glycol, diethylene glycol, propylene oxide, 1,4-butanediol, triethylene glycol, tetraethylene glycol, polyethylene glycol, glycerin, trimethylolpropane, pentaerythritol, sorbitol, 1,6-hexanediol, or 1,2,6-hexanetriol; epoxyacrylates which are prepared by introducing (meth) acrylic acid to epoxy resins such as bisphenol A-epichlorohydrin-(meth)acrylic acid, phenol novolak-epichlorohydrin-(meth)acrylic acid; urethane acrylates which are prepared by introducing (meth)acrylic acid to urethane resins such as ethylene glycol-adipic acid-tolylenediisocyanate-2-hydroxyethyl acrylate, polyethylene glycol-trorensiisocyanate-2-hydroxyethyl acrylate, hydroxyethylphthalyl methacrylate-xylene diisocyanate, 1,2-polybutadiene glycol-tolylenediisocyanate-2-hydroxyethyl acrylate, or trimethylolpropane-propylene glycol-tolylenediisocyanate-2-hydroxyethyl acrylate; silicone resin acrylates such as polysiloxane acrylate or polysiloxane-diisocyanate-2-hydroxyethyl acrylate; alkyd modified acrylates which are prepared by introducing a (meth)acryloyl group to oil modified alkyd resins; and spirane resin acrylates.

The photosensitive composition according to the present invention is capable of incorporating monomers such as phosphazene monomers, triethylene glycol, isocyanuric acid EO (ethylene oxide) modified diacrylate, isocyanuric acid EO modified triacrylate, dimethyloltricyclodecane diacrylate, trimethylolpropane acrylic acid benzoic acid ester, alkylene glycol type modified acrylic acid, or urethane modified acrylate, as well as addition-polymerizable oligomers and pre-polymers having constituting units formed of the above polymers.

Further listed as compounds usable in combination are phosphoric acid ester compounds having at least one (meth) acryloyl group. The above compounds are those in which at least one of the hydroxyl groups of phosphoric acid undergoes esterification.

Listed as others may be the compounds described in Japanese Patent O.P.I. Publication Nos. 58-212994, 61-6649, 62-46688, 62-48589, 62-173295, 62-187092, 63-67189, and 1-244891. Further, in the present invention, appropriately employed may be the compounds described on pages 286-294 of "11290 no Kagaku Shohin (11290 Chemical Products)", Kagakukoqyo Nippo-sha, and on pages 11-65 of "UV•EB Handbook (Genryo Hen, (Raw Material Part)), Kobunshi Kankokai. Of these, the compounds having at least two acryl or methacryl groups are preferred in the present invention, and further, those exhibiting a molecular weight of at most 10,000 but preferably at most 5,000 are preferred.

Further, preferably usable is an addition-polymerizable ethylenic double bond-containing compound having a tertiary amino group in a molecule. The structures are not particularly limited, but preferably employed are those which are prepared by modifying tertiary amine compounds having a hydroxyl group employing glycidyl methacrylate, methacrylic acid chloride, or acrylic acid chloride. Specifically preferably employed are polymerizable compounds described in Japanese Patent O.P.I. Publication Nos. 1-165613, 1-203413, and 1-197213.

Further in the present invention, it is preferable to use the reaction products of polyhydric alcohols having a tertiary amino group in the molecule, diisocyanate compounds, and compounds having a hydroxyl group as well as an addition-polymerizable ethylenic double bond in the molecule. Particularly, a compound having a tertiary amino group and an amide bond is preferably employed.

Polyhydric alcohols having a tertiary amino group in the molecule, as described herein, include, but are not limited to, triethanolamine, N-methyldiethanolamine, N-ethyldiethanolamine, N-n-butyldiethanolamine, N-tert.-butyldiethanolamine, N,N-di(hydroxyethyl)aniline, N,N,N',N'-tetra-2-hydroxypropylethylenediamine, p-tolyldiethanolamine, N,N,N',N'-tetra-2-hydroxyethylethylenediamine, N,N-bis(2-hydroxypropyl)aniline, allyldiethanolamine, 3-(dimethylamino)-1,2-propanediol, 3-diethylamino-1,2-propanediol, N,N-di (n-propyl) amino-2,3-propanediol, N,N-di(iso-propyl) amino-2,3-propanediol, and 3-(N-methyl-N-benzylamino)-1,2-propanediol.

Diisocyanate compounds include, but are not limited to, butane-1,4-diisocyanate, hexane-1,6-diisocyanate, 2-methylpentane-1,5-diisocyanate, octane-1,8-diisocyanate, 1,3 diisocyanatomethyl-cyclohexane, 2,2,4-trimethylhexane-1,6-diisocyanate, isoholondiisocyante, 1,2-phenylene diisocyanate, 1,3-phenylene diisocyanate, 1,4-phenylene diisocyanate, trilene-2,4-diisocyanate, trilene-2,5-diisocyanate, trilene-2,6-diisocyanate, 1,3-di(isocyanatomethyl)benzene, and 1,3-bis(1-isocyanato-1-methylethyl)benzene.

Examples of compounds, having a hydroxyl group and an addition-polymerizable ethylenic double bond in the molecule, include 2-hydroxyethyl methacrylate, 2-hyroxyethyl acrylate, 4-hydroxybutyl acrylate, 2-hydroxypropylene-1,3-dimethacrylate, and 2-hydroxypropylene-1-methacrylate-3-acrylate.

These reactions are common for diol compounds, diisocyanate compounds, or hydroxyl group containing acrylate compounds, and may be performed in the same manner as the method to synthesize urethane acrylates.

Listed below are specific examples of reaction products of polyhydric alcohols having a tertiary amine group in their structure, diisocyanate compounds, and compounds having a. hydroxyl group and a addition-polymerizable ethylenic double bond in their structure.

M-1: reaction product of triethanolamine (1 mol), hexane-1, 6-diisocyanate (3 mol), and 2-hydroxyethyl methacrylate (3 mol)

M-2: reaction product of triethanolamine (1 mol), isophoronediisocyanate (3 mol), and 2-hydroxyethyl acrylate (3 mol)

M-3: reaction product of N-n-butyldiethanolamine (1 mol), 1,3-bis(1-isocyanato-1-methyethyl)benzene (2 mol), and 2-hydroxypropylene-1-metahcrylate-3-acrylate (2 mol)

M-4: reaction product of N-n-butylethanolamine (1 mol), 1,3-di(isocyanatomethyl)benzene (2 mol), and 2hydroxypropylene-1-methacrylate-3-acrylate (2 mol)

M-5: reaction product of N-methyldiethanolamine (1 mol), trilene-2,4-diisocyanate (2 mol), and 2-hydroxypropylene-1, 3-dimethacrylate (2 mol)

M-6: reaction product of triethanolamine (1 mol), 1,3-bis (1-isocyanato-1-methyethyl)benzene (3 mol), and 2-hydroxyethyl methacrylate (3 mol)

M-7: ethylenediaminetetraethanol (1 mol), 1,3-bis(1-isocyanato-1-methyethyl)benzene (4 mol), and 2-hydroxyethyl methacrylate (4 mol)

In addition, usable are acrylates or alkyl acrylates described in Japanese Patent O.P.I. Publication Nos. 1-105238 and 2-127404.

The addition amount of the ethylenic double bond-containing compound is preferably 5-80% by weight, based on the photosensitive layer, and more preferably 15-60% by weight.

(Support)

Supports of the present invention are thin plates or film capable of carrying a photosensitive layer, and preferably incorporate a hydrophilic surface on the photosensitive layer forming side.

Listed as supports of the present invention are, for example, metal plates made of aluminum, stainless steel, chromium, or nickel, as well as those which are prepared by laminating a thin layer of any of the above metals or vacuum evaporating the same onto a plastic film such as polyester film, polyethylene film, or polypropylene film. Also employed as supports may be polyester film, vinyl chloride film or nylon film, the surface of which is subjected to hydrophilic treatment. However, aluminum supports are preferably employed. In the case of aluminum supports, employed are aluminum or aluminum alloys.

Various kinds of aluminum alloys are usable. For example, employed may be alloys of aluminum combined with metals such as silicon, copper, manganese, magnesium, chromium, zinc, lead, bismuth, nickel, titanium, sodium, or iron. Further, employed as aluminum supports may be those which have been subjected to surface roughening to provide water retentivity.

It is preferable that prior to surface roughening (being a graining treatment), supports are subjected to degreasing to remove rolling oil from the surface. Employed as degreasing are degreasing employing solvents such as TRICHLENE or thinner and emulsion degreasing employing emulsions such as triethanol. Further, employed as degreasing may be an aqueous alkali solution incorporating sodium hydroxide. By employing an aqueous alkali solution incorporating sodium hydroxide, it is possible to remove stains and oxidized layers capable of being not removed only by the above degreasing. When the aqueous alkali solution is employed for decreasing, smut is formed on the support surface. In such a case, it is preferable to perform desmut by immersing the treated support in acid such as phosphoric acid, nitric acid, sulfuric acid, chromic acid, or a mixture thereof.

Listed as surface roughening methods are, for example, mechanical methods and etching methods utilizing electrolysis. Employed mechanical surface roughening methods are not particularly limited, but a brush polishing method and a honing polishing method are preferred. Electrochemical roughening methods are also not particularly limited, but a method is preferred in which surface roughening is electrochemically achieved in an acidic electrolyte.

After surface roughening employing the above electrochemical surface roughening method, it is preferable to immerse the resulting support in an aqueous acid or alkali solution to remove any aluminum waste particles. Employed as such acids are, for example, sulfuric acid, persulfuric acid, hydrofluoric acid, phosphoric acid, nitric acid, and hydrochloric acid, while employed as alkalis are, for example, sodium hydroxide and potassium hydroxide. Of these, it is preferable to employ the aqueous alkali solution. The dissolved amount of aluminum on the surface is preferably 0.5-5 g/m$^2$. It is preferable that after immersing the support into the aqueous alkali solution, neutralization is affected via immersion of the resulting support into phosphoric acid, nitric acid, sulfuric acid, chromic acid, or a mixture thereof.

To achieve the desired surface roughening, a mechanical surface roughening method and an electrochemical surface roughening method may be singly employed, or surface roughening may be performed in such a manner that a mechanical surface roughening method is initially employed followed by an electrochemical one.

After the above surface roughening method, it is possible to perform an anodizing treatment. Anodizing treatments are not particularly limited and any appropriate conventional method may be employed, whereby an oxidized layer is formed on the support surface.

If desired, anodized supports may be subjected to sealing treatment. It is possible to perform such a sealing treatment employing the method known in the art such as a hot water treatment, a soda silicate treatment, an aqueous bichromate solution treatment, a nitrite treatment, or an ammonium acetate treatment.

Further, suitably employed are those which are subbed, after performing these treatments, with, for example, water-soluble resins such as polyvinylsulfonic acid, polymers and copolymers having a sulfonic acid group on the side chain, polyacrylic acid, water-soluble metal salts (such as zinc borate), yellow dyes, or amine salts. Further, preferably employed is the sol-gel treated substrate disclosed in Japanese Patent O.P.I. Publication No. 5-304358, in which a functional group, capable of inducing an addition reaction, is subjected to covalent bonding.

(Photopolymerization Initiator)

Photopolymerization initiators of the present invention are compounds capable of initiating polymerization of the foregoing polymerizable ethylenic unsaturated bond-containing compound via image exposure, and examples which are preferably employed include biimidazole compounds, iron arene complex compounds, titanocene, polyhalogen compounds, and monoalkyltriaryl compounds. Of these, particularly preferred are biimidazole compounds and iron arene complex compounds. In addition, it is preferred to include a polyhalogen compound.

(Biimidazole Compound)

The biimidazole compounds of the present invention are biimidazole derivatives, and include the compounds described in Japanese Patent O.P.I. Publication No. 2003-295426.

In the present invention, preferably incorporated as such biimidazole compounds are hexaarylbiimidazole (HABI, a dimer of triarylimidazole) compounds.

The production process of HABIs is described in DE No. 1,470,154, while use of these in a photopolymerizable composition is described in EP Nos. 24,629, and 107,792, U.S. Pat. No. 4,410,629, EP No. 215,453, and DE No. 3,211,312.

Examples of preferable derivatives include 2,4,5,2',4',5'-hexaphenylbiimidazole, 2,2'-bis(2-chlorophenyl) -4,5,4',5'-tetraphenylbiimidazole, 2,2'-bis(2-bromophenyl) -4,5,4',5'-tetraphenylbiimidazole, 2,2'-bis(2,4-dichlorophenyl) -4,5,4',5'-tetraphenylbiimidazole, 2,2'-bis(2-chlorophenyl) -4,5,4',5'-tetrakis (3-methoxyphenyl)biimidazole, 2,2'-bis(2-chlorophenyl)-4,5,4',5'-tetrakis(3,4,5-trimethoxyphenyl)-biimidazole, 2,5,2',5'-tetrakis(2-chlorophenyl) -4,4'-bis(3,4-dimethoxyphenyl)biimidazole, 2,2'-bis(2,6-dichlorophenyl) -4,4,4',5'-tetraphenylbiimidazole, 2,2'-bis(2-nitrophenol)-4,5, 4',5'-tetraphenylbiimidazole, 2,2'-di-o-tolyl-4,5,4',5'- tetraphenylbiimidazole, 2,2'-bis(2-ethoxyphenyl) -4,5,4',5'-tetraphenylbiimidazole, and 2,2-bis82,6-difluorophenyl)-4,5,4',5'-tetraphenylbiimidzole.

The amount of HABI is typically in the range of 0.01-30% by weight with respect to the total weight of the non-volatile component of the photosensitive composition, but is preferably in the range of 0.5-20% by weight.

(Iron Arene Complex Compound)

The iron arene complex compounds of the present invention are those represented by following Formula (1).

$$[A\text{-}Fe\text{---}B]^+X^- \quad \text{Formula (1)}$$

wherein A represents a substituted or unsubstituted cyclopentadienyl group or a cyclohexadienyl group, B represents a compound having an aromatic ring, and $X^-$ represents an anion.

Listed as substituents of a substituted cyclopentadienyl or cyclohexadienyl group are an alkyl group such as a methyl or ethyl group, a cyano group, an acetyl group, and a halogen atom.

Specific examples of compounds having an aromatic ring include benzene, toluene, xylene, cumene, naphthalene, 1-methylnaphthalene, 2-methylnaphthalene, biphenyl, fluorene, anthracene, and pyrene.

Specific examples of $X^-$ include $PF_6^-$, $BF_4^-$, $SbF_6^-$, $AlF_4^-$, and $CF_3SO_3^-$.

The content ratio of the iron arene complex compounds is preferably 0.1-20% by weight with respect to the polymerizable group containing compounds, but is more preferably 0.1-10% by weight.

Examples of the iron arene complex compound include:

Fe-1: ($\eta^6$-benzene)($\eta^5$-cyclopentadienyl)iron (II) hexafluorophosphate;
Fe-2: ($\eta^6$-toluene)($\eta^5$-cyclopentadienyl)iron (II) hexafluorophosphate;
Fe-3: ($\eta^6$-cumene)($\eta^5$-cyclopentadienyl)iron (II) hexafluorophosphate;
Fe-4: ($\eta^6$-benzene)($\eta^5$-cyclopentadienyl)iron (II) hexafluoroarsenate;
Fe-6: ($\eta^6$benzene)($\eta^5$-cyclopentadienyl)iron (II) tetrafluoroborate;
Fe-6: ($\eta^6$-naphthalene)($\eta^5$-cyclopentadienyl)iron (II) hexafluorophosphate;
Fe-7: ($\eta^6$-anthracene)($\eta^5$-cyclopentadienyl)iron (II) hexafluorophosphate;
Fe-8: ($\eta^5$-pyrene) ($\eta^5$-cyclopentadienyl)iron (II) hexafluorophosphate;
Fe-9: ($\eta^6$-benzene)($\eta^5$-cyanocyclopentadienyl)iron (II) hexafluorophosphate;
Fe-10: ($\eta^6$-toluene)($\eta^5$-acetylcyclopentadienyl)iron (II) hexafluorophosphate;
Fe-11: ($\eta^6$-cumene)($\eta^5$-cyclopentadienyl)iron (II) tetrafluoroborate;
Fe-12: ($\eta^6$-benzene)($\eta^5$-carboethoxycyclohexadienyl)iron (II) hexafluorophosphate;
Fe-13: ($\eta^6$-benzene)($\eta^5$-1,3-dichlorocyclohexadienyl)iron (II) hexafluorophosphate;
Fe-14: ($\eta^6$-cyanobenzene)($\eta^5$-cyclohexadienyl)iron (II) hexafluorophosphate;
Fe-15: ($\eta^6$-acetophenone)($\eta^5$-cyclohexadienyl)iron (II) hexafluorophosphate;
Fe-16: ($\eta^6$-methyl benzoate)($\eta^5$-cyclopentadienyl)iron (II) hexafluorophosphate;
Fe-17: ($\eta^6$-benzene sulfonamide)($\eta^5$-cyclopentadienyl)iron (II) tetrafluoroborate;
Fe-18: ($\eta^6$-benzamide)($\eta^5$-cyclopentadienyl)iron (II) hexafluorophosphate;
Fe-19: ($\eta^6$-cyanobenzene)($\eta^5$-cyanocyclopentadienyl)iron (II) hexafluorophosphate;
Fe-20: ($\eta^6$-chloronaphthalene)($\eta^5$-cyclopentadienyl)iron (II) hexafluorophosphate;
Fe-21: ($\eta^6$-anthracene)($\eta^5$-cyanocyclopentadienyl)iron (II) hexafluorophosphate;
Fe-22: ($\eta^6$-chlorobenzene)($\eta^5$-cyclopentadienyl)iron (II) hexafluorophosphate; and
Fe-23: ($\eta^6$-chlorobenzene)($\eta^5$-cyclopentadienyl)iron (II) tetrafluoroborate.

These compounds can be synthesized according to a method described in Dokl. Akd. Nauk. SSSR 149 615 (1963).

Titanocene compounds include those described in JP-A Nos. 63-41483 and 2-291. Further preferably specific examples include bis (cyclopentadienyl) -Ti-di-chloride, bis (cyclopentadienyl)-Ti-bis-phenyl, bis(cyclopentadienyl)-Ti-bis-2,3,4,5,6-pentafluorophenyl, bis (cyclopentadienyl)-Ti-bis 2,3,5,6-tetrafluorophenyl, bis(cyclopentadienyl)-Ti-bis-2,4,6-trifluorophenyl, bis(cyclopentadienyl)-Ti-bis-2,6-difluorophenyl, bis(cyclopentadienyl)-Ti-bis-2,4-difluorophenyl, bis(methylcyclopentadienyl)-Ti-bis-2,3,4,5,6-pentafluorophenyl, bis(methylcyclopentadienyl)-Ti-bis-2,3,5,6-tetrafluorophenyl, bis (methylcyclopentadienyl)-Ti-bis-2,6-difluorophenyl (being IRGACURE 727L, produced by Ciba Specialty Chemicals Co.), bis(cyclopentadienyl)-bis (2,6-difluoro-3-pyri-1-yl)phenyl) titanium (being IRGACURE 784, produced by Ciba Specialty Chemicals Co.), bis(cyclopentadienyl)-bis (2,4,6-trifluoro-3-(pyri-1-yl)phenyl) titanium, and bis(cyclopentadienyl)-bis(2,4,6-trifluoro-3-(2-5-dimthylpyri-1-yl) phenyl) titanium.

(Polyhalogen Compound)

The Polyhalogen compound is preferably contained as a photopolymerization initiator.

The polyhalogen compounds are those which have a trihalogenmethyl group, a dihalogenmethyl group, or a halogenmethyl group. Particularly preferably employed are the halogen compounds represented by following Formula (2) and the compounds in which the above group is substituted for an oxadiazole ring. Of these, particularly preferably employed are the halogen compounds represented by following Formula (3).

$$R^1\text{---}CY_2\text{---}(C=O)\text{---}R^2 \quad \text{Formula (2)}$$

wherein $R^1$ represents a hydrogen atom, a halogen atom, an alkyl group, an aryl group, an acyl group, an alkylsulfonyl group, an arylsulfonyl group, an iminosulfonyl group, or a cyano group; $R^2$ represents a univalent substituent; $R^1$ and $R^2$ may be joined together to form a ring; and Y represents a halogen atom.

$$CY_3\text{---}(C=O)\text{---}X\text{---}R^3 \quad \text{Formula (3)}$$

wherein $R^3$ represents a univalent substituent; X represents —O— or —$NR^4$— where $R^4$ represents a hydrogen atom or an alkyl group; when X is —$NR^4$—, $R^3$ and $R^4$ may be joined together to form a ring; and Y represents a halogen atom. Of these, particularly preferably employed are those having a polyhalogen acetylamide group.

Further preferably employed are compounds in which a polyhalogen methyl group is substituted for an oxadiazole ring.

Listed as monoalkyltriaryl borate compounds are those described in Japanese Patent O.P.I. Publication Nos. 62-150242 and 62-143044. More preferred specific examples include tetra-n-butyl ammonium • n-butyltrinaphthalene-1-yl-borate, tetra-n-butyl ammonium • n-butyl-triphenyl-borate, tetra-n-butyl ammonium • n-butyl-tri-(4-tert-butylphenyl)-borate, tetra-n-butyl ammonium • n-hexyl-tri-(3-chloro-4-methylphenyl) -borate, and tetra-n-butyl ammonium • n-hexyl-tri-(3-fluorophenyl) -borate.

In the present invention, simultaneously employed as a photopolymerization initiator may be others known as a photopolymerization initiator.

(Sensitizing Dye)

Sensitizing dyes having a maximum absorption wavelength of 300-1200 nm can be employed for the photosensitive layer of the present invention. Of these, particularly, a positive effect on the present invention can be produced by containing a sensitizing dye having a maximum absorption wavelength of 350-450 nm.

Examples of such sensitizing dyes include cyanine, merocyanine, porphyrin, spiro compounds, ferrocene, fluorene, fulgide, imidazole, perylene, phenazine, phenothiazine, acridine, azo compounds, diphenylmethane, triphenylmethane, triphenylamine, coumarin derivatives, quinacridone, indigo, styryl, pyrylium compounds, pyrromethene compounds, pyrazolotriazole compounds, benzothiazole compounds, barbituric acid derivatives, thiobarbituric acid derivatives, and keto alcohol borate complexes.

Of these sensitizing dyes, preferably employed are the coumarin based dyes represented by following Formula (4).

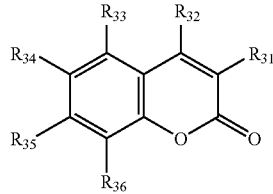

Formula (4)

In the above formula, $R_{31}$-$R_{36}$ each represent a hydrogen atom or a substituent. Listed as such substituents are an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group, or a pentadecyl group); a cycloalkyl group (for example, a cyclopentyl group or a cyclohexyl group); an alkenyl group (for example, a vinyl group or an allyl group); an alkynyl group (for example, an ethynyl group or a propagyl group); an aryl group (for example, a phenyl group or a naphthyl group); a heteroaryl group (for example, a furyl group, a thienyl group, a pyridyl group, a pyridazyl group, a pyrimidyl group, a pyrazyl group, a triazyl group, an imidazolyl group, a pyrazolyl group, a thiazolyl group, a benzimidazolyl group, a benzoxazolyl group, a quinazoyl group, or a phthalazyl group); a heterocyclyl group (for example, a pyrrolidyl group, an imidazolydyl group, a morpholyl group, or an oxazolydyl group); an alkoxy group (for example, a methoxy group, an ethoxy group, a propyloxy group, a pentyloxy group, a hexyloxy group, an octyloxy group, or a dodecyloxy group); a cycloalkoxy group (for example, a cyclopentyloxy group or a cyclohexyloxy group); an aryloxy group (for example, a phenoxy group or a naphthyloxy group); an alkylthio group (for example, a methylthio group, an ethylthio group, a propylthio group, a pentylthio group, a hexylthio group, an octylthio group, or a dodecylthio group); a cycloalkylthio group (for example, a cyclopentylthio group or a cyclohexylthio group); an arylthio group (for example, a phenylthio group or a naphthylthio group); an alkoxycarbonyl group (for example, a methoxycarbonyl group, an ethyloxycarbonyl group, a butyloxycarbonyl group, an octyloxycarbonyl group, or a dodecyloxycarbonyl group); an aryloxycarbonyl group (for example, a phenyloxycarbonyl group, or a naphthyloxycarbonyl group); a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, or a 2-pyridylaminosulfonyl group); an acyl group (for example, an acetyl group, an ethylcarbonyl group, a propylcarbonyl group, a pentylcarbonyl group, a cyclohexylcarbonyl group, an octylcarbonyl group, a 2- ethyihexylcarbonyl group, a dodecylcarbonyl group, a phenylcarbonyl group, a naphthylcarbonyl group, or a pyridylcarbonyl group); an acyloxy group (for example, an acetyloxy group, an ethylcarbonyloxy group, a butylcarbonyloxy group, an octylcarbonyloxy group, a dodecylcarbonyloxy group, or a phenylcarbonyloxy group); an amide group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethyihexylcarbonylamino group, an octylcarbonylamino group, a dodecylcarbonylamino group, a phenylcarbonylamino group, or a naphthylcarbonylamino group); a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, or a 2-pyridylaminocarbonyl group); a ureido group (for example, a methylureido group, an ethylureido group, a pentylureido group, a cyclohexylureido group, an octylureido group, a dodecylureido group, a phenylureido group, a naphthylureido group, or a 2-pyridylaminoureido group); a sulfinyl group (for example, a methylsulfinyl group, an ethylsulfinyl group, a butylsulfinyl group, a cyclohexylsulfinyl group, a 2-ethyihexylsulfinyl group, a dodecylsulfinyl group, a phenylsulfinyl group, a naphthylsulfinyl group, or a 2-pyridylsulfinyl group); an alkylsulfonyl group (for example, a methylsulfonyl group, an ethylsulfonyl group, a butylsulfinyl group, a cyclohexylsulfonyl group, a 2-ethyihexylsulfonyl group, or a dodecylsulfonyl group); an arylsulfonyl group (a phenylsulfonyl group, a naphthylsulfonyl group, or a 2-pyridylsulfonyl group); an amino group (for example, an amino group, an ethylamino group, a dimethylamino group, a butylamino group, a cyclopentylamino group, a 2-ethyihexylamino group, a dodecylamino group, an anilino group, a naphthylamino group, or a 2-pyridylamino group); and a halogen atom (for example, a fluorine atom, a chlorine atom, or a bromine atom); as well as a cyano group, a nitro group, and a hydroxyl group. These substituents may be substituted with the above substituents. Further, a plurality of substituents may be joined to form a ring.

Of these, most preferred is coumarin in which $R_{35}$ is an amino group, an alkylamino group, a dialkylamino group, an arylamino group, or an alkylamino group. In such a case, it is possible to preferably employ one in which an alkyl group substituted for the amino group forms a ring with substituents of $R_{34}$ and $R_{36}$.

Further, it is more preferable that either or both $R_{31}$ and $R_{32}$ each represents an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group, or a pentadecyl group); a cycloalkyl group (for example, a cyclopentyl group or a cyclohexyl group); an alkenyl group (for example, a vinyl group or an allyl group); an aryl (for example, a phenyl group or a naphthyl group); a heteroaryl group (for example, a furyl group, a thienyl group, a pyridyl group, a pyridazyl group, a pyrimidyl group, a pyrazyl group, a triazyl group, an imidazolyl group, a pyrazolyl group, a thiazolyl group, a benzimidazolyl group, a benzoxazolyl group, a guinazoyl group, or a phthalazyl group); a heterocyclyl group (for example, a pyrrolidyl group, an imidazolydyl group, a morpholyl group, or an oxazolydyl group); an alkoxycarbonyl group (for example, a methyloxycarbonyl group, an ethyloxycarbonyl group, a butyloxycarbonyl group, an octyloxycarbonyl group, or a dodecyloxycarbonyl group); an aryloxycarbonyl group (for example, a phenyloxycarbonyl group, or a naphthyloxycarbonyl group); an acyl group (for example, an acetyl group, an ethylcarbonyl group, a propylcarbonyl group, a pentylcarbonyl group, a cyclohexylcarbonyl group, an octylcarbonyl group, a 2ethyihexylcarbonyl group, a dodecylcarbonyl group, a phenylcarbonyl group, a naphthylcarbonyl group, or a pyridylcarbonyl group); an acyloxy group (for example, an acetyloxy group, an ethylcarbonyloxy group, a butylcarbonyloxy group, an octylcarbonyloxy group, a dodecylcarbonyloxy group, or a phenylcarbonyloxy group); a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2- ethyihexylaminocarbonyl group, a dodecylaminocarbonyl group, a phenylaminocarbonyl group, a naphthylaminocarbonyl group, or a 2-pyridylaminocarbonyl group); a suit inyl group (for example, a methylsulfinyl group, an ethylsulfinyl group, a butylsulfinyl group, a cyclohexylsulfinyl group, a 2-ethyihexylsulfinyl group, a dodecylsulfinyl group, a phenylsulfinyl group, a naphthylsulfinyl group, or a 2-pyridylsulfinyl group); an alkylsulfonyl group (for example, a methylsulfonyl group, an ethylsulfonyl group, a butylsulfinyl group, a cyclohexylsulfonyl group, a 2-ethylhexylsulfonyl group, or a dodecylsulfonyl group); an arylsulfonyl group (a phenylsulfonyl group, a naplithylsulfonyl group, or a 2-pyridylsulfonyl group); a halogen atom (for example, a fluorine atom, a chlorine atom, or a bromine atom); as well as a cyano group, a nitro group, and a halogenated alkyl group (for example, a trifluoromethyl group, a tribromomethyl group, or a trichioromethyl group.

Preferred specific examples include, but are not limited to, the compounds listed below.

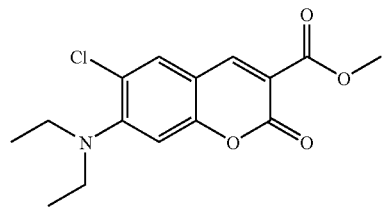
D1

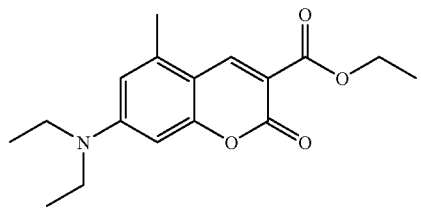
D2

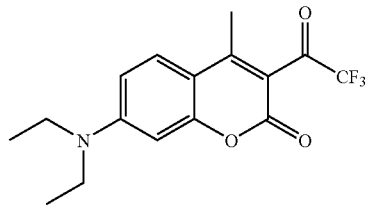
D3

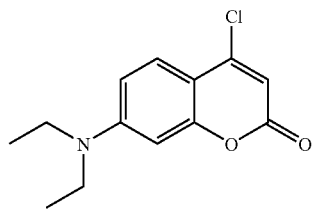
D4

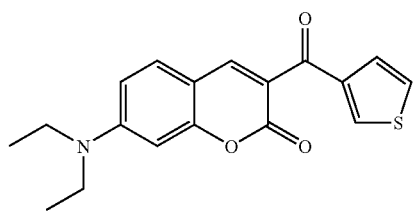
D5

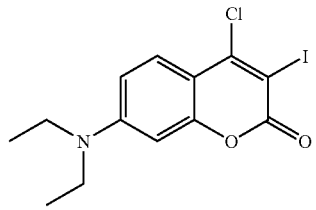
D6

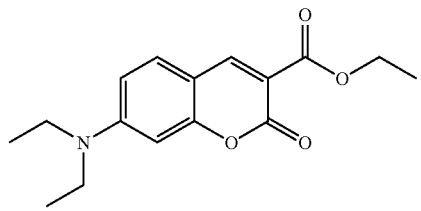
D7

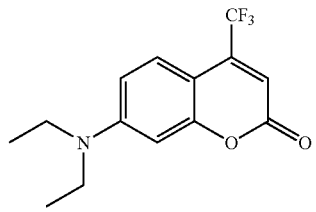
D8

-continued
D9
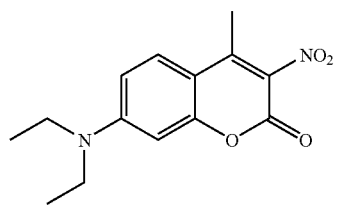
D10
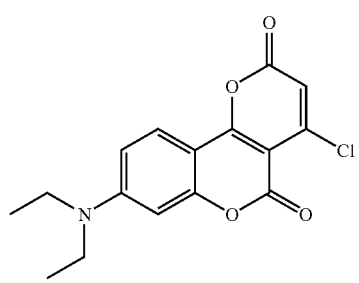
D11
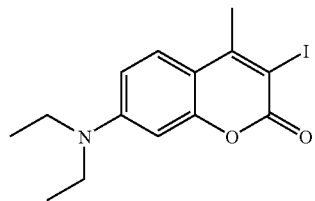
D12
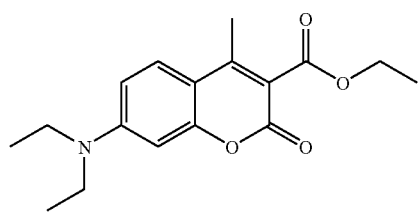
D13
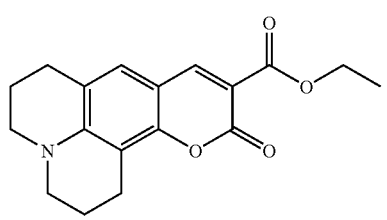
D14
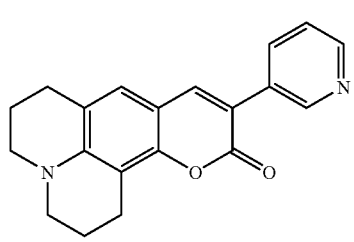
D15
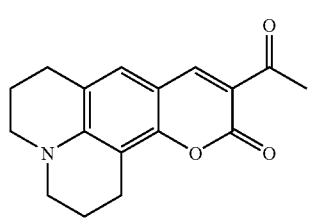
-continued
D16
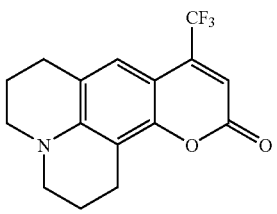
D17
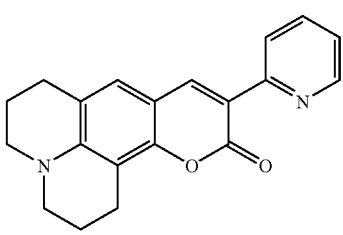
D18
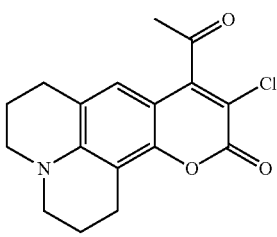
D19
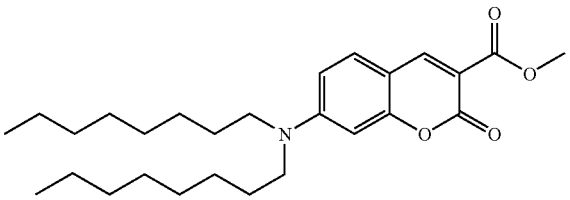
D20
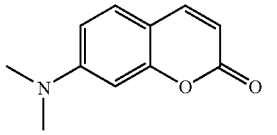
D21
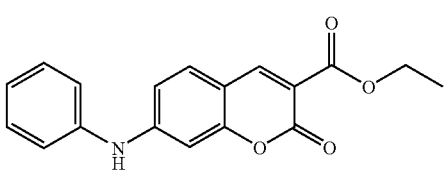
D22

-continued

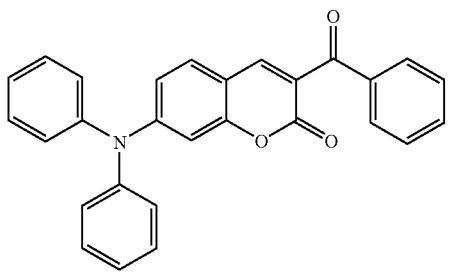
D23

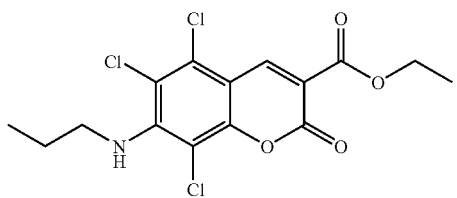
D24

Other than the above specific examples, it is possible to employ coumarin derivatives B-1 through B-22 of Japanese Patent O.P.I. Publication No. 8-129258, coumarin derivatives D-1 through D-32 of Japanese Patent O.P.I. Publication No. 2003-21901, coumarin derivatives 1 through 21 of Japanese Patent O.P.I. Publication No. 2002-363206, coumarin derivatives 1 through 40 of Japanese Patent O.P.I. Publication No. 2002-363207, coumarin derivatives 1 through 34 of Japanese Patent O.P.I. Publication No. 2002-363208, and coumarin derivatives 1 through 56 of Japanese Patent O.P.I. Publication No. 2002-363209.

Successively described will be various additives capable of being added to photosensitive compositions in the present invention, supports as a photosensitive planographic printing plate, protective layers, coating of photosensitive compositions onto a support, and image recording methods of photosensitive planographic printing plates.

(Various Additives)

Other then the above components, in order to inhibit excessive polymerization of polymerizable ethylenic double bond monomers during production, or storage, of planographic printing plates, it is preferable to incorporate polymerization inhibitors in the photosensitive layer of the present invention. Listed as such appropriate polymerization inhibitors are hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitrosophenylhydroxylamine Ce(III) salts, and 2-t-butyl-6-(3-t-butyl-2-hydroxy-5-methylbenzyl)-4-methylphenyl acrylate.

The addition amount of the polymerization inhibitors is preferably 0.01-5% by weight, based on the total solid weight of the above composition. Further, if desired, in order to minimize polymerization inhibition due to oxygen, behenic acid or higher fatty acid derivatives such as behenic acid amide may be incorporated or localized in the surface of the photosensitive layer during the drying process. The added amount of the higher fatty acid derivatives is preferably 0.5-10% by weight, based on the total composition.

Further, it is possible to employ colorants. Appropriately employed as such colorants may be those known in the art, including commercial products. Examples include those described in "Ganryo Binran (Pigment Handbook)", Revised New Edition, Edited by Nihon Ganryo Gijutsu Kyokai (Seibundo Shinkosha), and the Color Index Handbook.

Listed as types of pigments are black pigment, yellow pigments, red pigments, brown pigments, violet pigments, blue pigments, green pigments, fluorescent pigments, and metal powder pigments. Specific examples include inorganic pigments (titanium dioxide, carbon black, graphite, zinc oxide, Prussian blue, cadmium sulfide, and iron sulfide, as well as chromates of lead, zinc, barium, or calcium), in addition to organic pigments (such as azo based, thioindigo based, anthraquinone based, anthoanthrone based, or triphenedioxazine based pigments, vat dye pigments, phthalocyanine pigments and derivatives thereof, and quinacridone pigments).

Preferably employed are pigments which exhibit no substantial absorption in the absorption wavelength region of spectral sensitizing dyes corresponding to the employed exposure laser beam in these pigments. In such a case, the reflection absorption of pigments, which is determined employing an integrating sphere in the wavelength of the used laser beam, is at most 0.05. Further, the added amount of pigments is preferably 0.1-10% by weight with respect to the solids of the above composition, but is more preferably 0.2-5% by weight.

In view of pigment absorption in the above photosensitive wavelength region and image visibility, it is preferable to employ violet pigments and blue pigments. Listed as such pigments may, for example, be cobalt blue, cerulean blue, alkali blue lake, phonatone blue 6G, Victoria blue lake, metal-free phthalocyanine blue, phthalocyanine blue, first sky blue, indanthrene blue, indigo, dioxane violet, isoviotanthrone violet, indanthrone blue, and indanthrone BC. Of these, more preferred are phthalocyanine blue and dioxane violet.

Further, the above photosensitive composition may be incorporated surface active agents as a coatability enhancing agent in the range in which the performance of the present invention is not adversely affected.

Further, in order to improve physical properties of the hardened layer, incorporated may be additives such as inorganic fillers and plasticizers such as dioctyl phthalate, dimethyl phthalate, or tricresyl phosphate. The addition amount is preferably at most 10% by weight, based on the total solid content.

Still further, preferably listed as solvents employed in the photosensitive layer liquid coating composition, which is prepared to provide the photosensitive layer according to the present invention, are, for example, alcohols including polyhydric alcohol derivatives such as sec-butanol, isobutanol, n-hexanol, benzyl alcohol, diethylene glycol, triethylene glycol, tetraethylene glycol, 1,5-pentanediol; ethers such as propylene glycol monobutyl ether, dipropylene glycol monomethyl ether, or tripropylene glycol monomethyl ether; ketones; and esters such as ethyl lactate, butyl lactate, diethyl oxalate, or methyl benzoate.

The planographic printing plate material of the present invention is manufactured by preparing a light sensitive layer coating solution containing the above-described components and then coating on a support the light sensitive layer coating solution to form a photosensitive layer on the support.

(Coating)

The resulting coating composition (photosensitive layer coating solution) is coated on the support according to a conventional method, and dried to obtain a planographic printing plate material. Examples of the coating method include an air doctor coating method, a blade coating method, a wire bar coating method, a knife coating method, a dip coating method, a reverse roll coating method, a gravure coating method, a cast coating method, a curtain coating method, and an extrusion coating method.

The drying temperature of the coated photosensitive layer is preferably 60-160° C., more preferably from 65-140° C., and still more preferably 70-120° C.

When the photosensitive layer in the present invention is photopolymerizable, an oxygen-shielding layer is preferably provided on the photosensitive layer. It is preferred that the oxygen-shielding layer is highly soluble in a developer (generally an alkaline solution).

Materials constituting the oxygen-shielding layer are preferably a hydrophilic polymeric compound selected from polyvinyl alcohol, polysaccharide, polyvinyl pyrrolidone, polyethylene glycol, gelatin, glue, casein, hydroxyethyl cellulose, carboxymethyl cellulose, methyl cellulose, hydroxyethyl starch, gum arabic, sucrose octacetate, ammonium alginate, sodium alginate, polyvinyl amine, polyethylene oxide, polystyrene sulfonic acid, polyacrylic acid, or a water soluble polyamide. These binders may be used alone or in combination. These materials, polyvinyl alcohol is more preferred, and polyvinyl alcohol having a degree of saponification of 90-100% is most preferred.

Examples of the polyvinyl alcohol include Gosenol AL-06, and NL-05, each manufactured by Nippon Gosei Kagaku Co. Ltd.; Kuraray Poval PVA 706, PVACST, and PVA 105, each manufactured by Kuraray Co., Ltd.; Moviol 30-92, Moviol 3-96, Moviol 4-98, and Moviol 4-99, each manufactured by Cralliant Co., Ltd.; Erkol 30/92, Erkol 25/100, Erkol 28/70, Erkol 4/98, and Erkol 5/99, each manufactured by Backerchem Co., Ltd.; Elvanol 70-06 and Elvanol 71-30, each manufactured by Dupont Co., Ltd; and Celvol 418, Celvol 425, Celvol 103, Celvol 125, each manufactured by Celanese Co., Ltd.

Of these polyvinyl alcohols, those having a degree of saponification of 90-98% are preferred, and those having a degree of saponification of 90-96% are more preferred.

As a material constituting the oxygen-shielding layer, vinyl pyrrolidone copolymer is preferably used, and vinyl pyrrolidone copolymer having not less than 40 mol % of a vinyl pyrrolidone unit and having a weight average molecular weight of 10,000-500,000 is more preferably used.

Vinyl pyrrolidone copolymer can be prepared, for example, via copolymerization of N-vinyl-2-pyrrolidone and a comonomer through a conventional radical polymerization process.

As the comonomer, those polymerizable ethylenic unsaturated bond-containing compounds as described above can be used. Vinyl acetate is especially preferred as the comonomer.

The vinyl pyrrolidone unit content in the vinyl pyrrolidone copolymer is preferably at least 40 mol %, and more preferably 40-80 mol %.

Examples of the vinyl pyrrolidone copolymer include Rubiscol VA37E, 371, 551, 64P, 64W, 73E, and 73W, each manufactured by BASF Japan Co., Ltd. The oxygen-shielding layer can further contain a hydrophilic material, a surfactant or a matting agent, if desired.

Examples of the hydrophilic material include polysaccharide, polyvinylpyrrolidone, polyethylene glycol, gelatin, hide glue, casein, hydroxyethyl cellulose, carboxymethyl cellulose, methyl cellulose, hydroxyethyl starch, gum Arabic, sucrose octaacetate, ammonium alginate, sodium alginate, polyvinylamine, polyethylene oxide, polystylene sulfonate, polyacrylic acid, water-soluble polyamide and so forth.

As the surfactant, an anionic surfactant, a nonionic surfactant, a cationic surfactant or an amphoteric surfactant can be used. Acetylene surfactants are preferably used.

As the matting agent, inorganic or organic particles with an average particle diameter of 0.05 to 10 μm can be used.

A coating liquid for the oxygen-shielding layer is obtained by dissolving the materials described above in a solvent. The coating liquid is coated on the light sensitive layer and dried to form an oxygen-shielding layer. The dry thickness of the protective layer is preferably 0.1-5.0 μm, and more preferably 0.5-3.0 μm.

(Oxygen-Shielding Layer Coating Solution)

The oxygen-shielding layer coating solution is obtained by dissolving the above-described material in a solvent comprised mainly of water.

Alcohols or polyhydric alcohols are used as solvents other than water.

In the present invention, the solvent comprised mainly of water is a solvent containing water in an amount of at least 50% by weight. In the present invention, the solvent is a solvent containing water in an amount of preferably at least 75% by weight, and more preferably at least 95% by weight.

The oxygen-shielding layer coating solution is coated on the photosensitive layer of the present invention, and dried to form a protective layer.

The drying temperature of the oxygen-shielding layer is preferably 50-160° C., more preferably 60-140° C. and still more preferably 70-120° C.

As coating methods of the oxygen-shielding layer coating solution, there are conventional ones such as an air doctor coating method, a blade coating method, a wire bar coating method, a knife coating method, a dip coating method, a reverse roll coating method, a gravure coating method, a cast coating method, a curtain coating method and an extrusion coating method.

EXAMPLE

Next, the present invention will be explained below employing examples, but the present invention is not limited thereto. In the examples, "parts" represents "parts by weight", unless otherwise specified.

(Preparation of Hydrophilic Support)

A 0.3 mm thick aluminum plate (material 1050, refining H16) was degreased at 65° C. for one minute in a 5% by weight sodium hydroxide aqueous solution, and subsequently washed with water.

This degreased aluminum support was immersed at 25° C. for one minute in a 10% by weight sulfuric acid aqueous solution to neutralize, and then washed with water. Next, this aluminum support was subjected to an electrolytic surface roughening treatment at 25° C. for 20 seconds with an alternating current at a current density of 50 A/dm$^2$ and a frequency of 50 Hz, employing a hydrochloric acid concentration of 11 g/L.

After conducting the electrolytic surface roughening treatment, the resulting aluminum support was washed, and desmutted in a 1% by weight sodium hydroxide aqueous solution maintained at 50° C. for 10 seconds. After washing the resulting, it was neutralized in 30% by weight of sulfuric acid maintained at 50° C., and again washed. Next, it was anodized in a 20% sulfuric acid solution at 25° C. for 40 seconds at a current density of 5 A/dm$^2$ and at a voltage of 15 V, and then washed.

A dipping treatment was conducted in a 0.44% by weight polyvinyl phosphonic acid aqueous solution at 75° C. for 30 seconds, washed with distilled water, and dried with cool air at 25° C. to prepare a support for a planographic printing plate.

The center line average surface roughness (Ra) of the support was 0.65 μm.

(Resin Synthesis)

Methyl methacrylate, methacrylic acid and ethyl methacrylate were added into a three-necked flask under a nitrogen atmosphere by the ratio as shown in Table 1, 100 parts of ethanol and 1.23 parts of α,α'-azobisisobutyronitrile were charged, and the resulting mixture was reacted in an oil-bath maintained at 80° C. under a nitrogen atmosphere for 6 hours to prepare high molecular weight polymers P1-P-14.

TABLE 1

| Kinds of Binder polymer | Resulting binder polymer composition (% by weight) | | | Tg (° C.) | Acid value (mgKOH/g) | Mw |
|---|---|---|---|---|---|---|
| | Methacrylic acid | Methyl methacrylate | Ethyl methacrylate | | | |
| P-1 | 8 | — | 92 | −4 | 52 | 30000 |
| P-2 | 14 | 16 | 70 | 32 | 91 | 30000 |
| P-3 | 14 | 36 | 50 | 58 | 91 | 30000 |
| P-4 | 14 | 56 | 30 | 84 | 91 | 30000 |
| P-5 | 14 | 69 | 17 | 100 | 91 | 30000 |
| P-6 | 14 | 81 | 5 | 116 | 91 | 30000 |
| P-7 | 14 | 86 | — | 122 | 91 | 30000 |
| P-8 | 30 | 70 | — | 145 | 192 | 30000 |

Tg: Glass transition point,
Mw: Weight average molecular weight

[Preparation of Planographic Printing Plate Material]

A photosensitive layer containing solution having the following composition was coated on a support which was subjected to a surface roughening treatment, employing a wire bar, and dried at 100° C. for 1.5 minutes to give a photosensitive layer with a dry thickness of 1.7 g/m². After that, a protective layer coating solution having the following composition was coated on the photosensitive layer employing an applicator, and dried at 75° C. for 1.5 minutes to give a protective layer with a dry thickness of 1.5 g/m² to prepare planographic printing plate material Nos. 1-14 having a protective layer provided on a photosensitive layer.

(Photosensitive Layer Coating Solution)

| | |
|---|---|
| Binder polymer (shown in Table 2) | 45.0 parts |
| Sensitizing dye A | 4.0 parts |
| Iron-arene compound (Photopolymerization initiator, IRGACURE 261, produced by Ciba Specialty Chemicals Co.) produced by Ciba Specialty Chemicals Co.) | 2.9 parts |
| Triazine compound (Photopolymerization initiator, TAZ-107, produced by Midori Kagaku Co., Ltd.) | 1.5 parts |
| Dipentaerythritol hexaacrylate (Polymerizable ethylenic double bond-containing compound, NK ESTER A-DPH, produced by Shinnakamura Kagaku Kogyol Co., Ltd.; Monomer SP: 9.05) | 35.0 parts |
| Polyethylene glycol #200 dimethacrylate (Polymerizable ethylenic double bond-containing compound, NK ESTER 4G, produced by Shinnakamura Kagaku Kogyol Co., Ltd.; Monomer SP: 9.89) | 10.0 parts |
| Phthalocyanine pigment (30% by weight MEK dispersion, MHI 454, produced by Mikuni Color Ltd.) | 3.0 parts |
| Hindered amine stabilizer (LS 770, produced by Sankyo Life-Tech Co., Ltd.) | 0.1 parts |
| Fluorine based surfactant (F178K, produced by Dainippon Ink and Chemicals, Inc.) | 0.1 parts |
| Amine compound (ANCAMIN K-54, produced by Air Products and Chemicals Inc.) | 1.5 parts |
| Cyclohexanone (boiling point: 155° C.) | 820 parts |

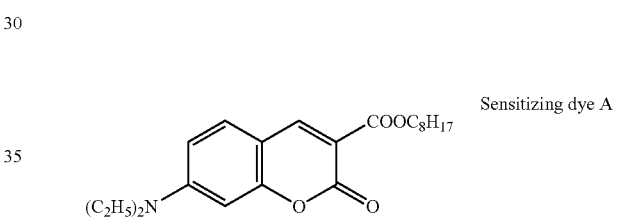

Sensitizing dye A

TABLE 2

| Planographic printing plate material No. | Content ratio of binder polymers (% by weight) |
|---|---|
| 1 | P-7 = 100 |
| 2 | P-3/P-7 = 10/90 |
| 3 | P-3/P-7 = 30/70 |
| 4 | P-1/P-7 = 30/70 |
| 5 | P-2/P-7 = 30/70 |
| 6 | P-4/P-7 = 30/70 |
| 7 | P-5/P-7 = 30/70 |
| 8 | P-6/P-7 = 30/70 |
| 9 | P-3/P-8 = 30/70 |
| 10 | P-5/P-6/P-8 = 30/20/50 |
| 11 | P-3/P-5/P-7 = 30/20/50 |
| 12 | P-3/P-7 = 70/30 |
| 13 | P-3/P-7 = 90/10 |
| 14 | P-3 = 100 |

(Protective Layer Coating Solution)

| | |
|---|---|
| Polyvinyl alcohol (AL06, produced by Nippon Gosei Kagaku Co., Ltd.) | 90.0 parts |
| PVP-VA copolymer (VA64W, produced by BASF) | 20.0 parts |

-continued

| | |
|---|---|
| Surfactant (Surfinol 465, produced by Nisshin Kagaku Co., Ltd.) | 0.5 parts |
| Water | 900 parts |

[Image Formation]

The above-obtained photopolymerizable planographic printing plate material samples were imagewise exposed at a resolution of 2400 dpi (dpi represents the dot numbers per 2.54 cm) employing a plate setter (NewsCTP, produced by ECRM Co., Ltd.) equipped with a laser source with an emission wavelength of 408 nm and an output power of 60 mW.

The printing plate material exposed to laser light was processed, employing a CTP automatic developing machine (PHW 32-V produced by Technigraph Co., Ltd.) having a heating section before development, a pre-washing section for removing a protective layer, a developing section charged with a developer described below, a washing section for removing a developer adhered to a printing plate and a gumming solution to protect the image line portion (a solution obtained by diluting GW-3, produced by Mitsubishi Chemical Co., Ltd., with water by a factor of 2) to prepare each of the planographic printing plate material samples.

Herein, the heating was carried out at a printing plate temperature of 115±5° C. for 15 seconds. The printing plate temperature was measured during treatment, employing a thermo label (produced by Nichiyu Giken Co., Ltd.) adhered to the roughened surface of the support.

<Developer Composition>

| | |
|---|---|
| Potassium silicate A | 8.0 parts |
| NEWCOL B-13SN (produced by Nippon Nyukazai Co., Ltd.) | 3.0 parts |
| Disodium ethylenediaminetetraacetate dihydrate | 0.1 parts |
| Potassium hydroxide | Amount giving pH 12.1 |

[Evaluation of Planographic Printing Plate Plate]

The planographic printing plates obtained as described above were evaluated. The evaluated results are shown in Table 3.

(Sensitivity)

Each of the planographic printing plate material samples was imagewise exposed as above to form a 100% solid image, while changing the exposure energy level, and then developed as described above to form a developed 100% solid image. Density of the developed solid image at each exposure energy level was measured through a densitometer D196 (produced by GRETAG Co., Ltd.). Herein, exposure energy providing 90% of the maximum density of the developed solid image was defined as sensitivity, and represented in terms of $\mu J/cm^2$.

(Developability)

The developer temperature was changed at 2° C. intervals to conduct a development treatment, and to evaluate developability at non-image portions.

Printing was performed after development to determine a lower limit at which neither stain at non-image portions nor ink residue at shadow portions is generated.

(Adhesion)

The resulting sample obtained above was scratched at a speed 1000 mm/min. with a sapphire needle having a tip diameter of 0.1 mm through a scratch tester Heidon-18 produced by Heidon Co., Ltd., load, the weight changed from 0 to 100 g, being applied to the sapphire needle. The minimum load at which the oxygen-shielding layer was peeled from the photosensitive layer was visually measured five times, and the average was regarded as a measure of oxygen-shielding layer adhesion.

(Printing Durability)

Employing the planographic printing plate sample prepared by exposing an image of a screen line number of 175 to light with 3 times the exposure amount of sensitivity obtained above to conduct a development treatment, printing was carried out on a press (DATYA1F-1 produced by Mitsubishi Heavy Industries, Ltd.), wherein coated paper, printing ink (Soybean oil ink, "Naturalith 100" produced by Dainippon Ink and Chemicals, Inc.), and dampening water (SG-51, H solution produced by Tokyo Ink Co., Ltd., Concentration: 1.5%) were used. The number (lowest) of printing cycles until dot reduction of 3% dot area at highlight portions was observed, or ink residue at shadow portions was generated was evaluated as a measure of printing durability.

(Dot Gain and Moisture Dependence After Exposure)

After each of the printing plates was placed standing for 2 hours under the conditions of humidity of 30% RH, 50% RH and 70% RH, each of the samples was exposed to light at a 50% output and at an optimal exposure amount, preheated, and developed. Subsequently, dot reproduction of each sample which was subjected to a treatment at 30% RH as well as 70% RH was compared with that at 50% RH. The above-described dot reproduction was measured employing CC DOT (produced by X-Rite Co., Ltd.).

TABLE 3

| *1 | Sensitivity ($\mu J/cm^2$) | Developability (° C.) | Adhesion (g) | Printing durability (Number) | Dot gain (Δ%) 70% RH | Dot gain (Δ%) 30% RH | Remarks |
|---|---|---|---|---|---|---|---|
| 1 | 8 | 31 | 10 | 320,000 | −8 | −3 | Comp. |
| 2 | 12 | 24 | 45 | 280,000 | −7 | −3 | Inv. |
| 3 | 15 | 24 | 50 | 250,000 | −7 | −3 | Inv. |
| 4 | 25 | 18 | 40 | 200,000 | −7 | −3 | Inv. |
| 5 | 20 | 20 | 45 | 220,000 | −7 | −3 | Inv. |
| 6 | 12 | 24 | 50 | 260,000 | −6 | −3 | Inv. |
| 7 | 10 | 25 | 60 | 280,000 | −5 | −2 | Inv. |
| 8 | 9 | 25 | 60 | 300,000 | −4 | −1 | Inv. |
| 9 | 10 | 26 | 60 | 300,000 | −5 | −2 | Inv. |
| 10 | 9 | 26 | 60 | 300,000 | −5 | −2 | Inv. |
| 11 | 17 | 25 | 45 | 240,000 | −5 | −2 | Inv. |

TABLE 3-continued

| *1 | Sensitivity (µJ/cm²) | Developability (°C.) | Adhesion (g) | Printing durability (Number) | Dot gain (Δ%) | | Remarks |
|---|---|---|---|---|---|---|---|
| | | | | | 70% RH | 30% RH | |
| 12 | 20 | 22 | 70 | 150,000 | −9 | −4 | Inv. |
| 13 | 28 | 22 | 80 | 130,000 | −9 | −4 | Inv. |
| 14 | 40 | 20 | 90 | 80,000 | −15 | −5 | Comp. |

*1: Planographic printing plate material No.
Inv.: Present invention
Comp.: Comparative example As is clear from Table 3, it is to be understood that planographic printing plate material No. 1 as the comparative example is inferior to any of planographic printing plate material Nos. 2-13 or the present invention in view of developability and adhesion, and planographic printing plate material No. 14 is also inferior to that of the present invention in view of sensitivity, printing durability and dot gain, and it is also to be understood that the planographic printing plate material of the present invention exhibits excellent printing performance such as excellent developability and oxygen-shielding layer adhesion, together with excellent moisture dependence after exposure.

EFFECT OF THE INVENTION

A planographic printing plate material exhibiting excellent developability, printing durability, together with excellent oxygen-shielding layer adhesion and moisture dependence after exposure can be provided via the present invention.

What is claimed is:

1. A planographic printing plate material comprising a support and provided thereon, a photosensitive layer,
   wherein the photosensitive layer comprises (A) at least two binder polymers comprising different glass transition points (Tg) from each other, wherein a smallest Tg difference among Tg differences of any two binder polymers is at least 10° C.; (B) a polymerizable ethylenic double bond-containing compound comprising a tertiary amino group and a urethane bond; and (C) a photopolymerization initiator.

2. The at least two binder polymers of claim 1, wherein the smallest Tg difference is at least 20° C.

3. The at least two binder polymers of claim 1, wherein at least one binder polymer has a Tg of at least 110° C.

4. The at least two binder polymers of claim 1, wherein at least one binder polymer has a Tg of at most 90° C.

* * * * *